United States Patent
Klimov et al.

(10) Patent No.: US 8,098,700 B2
(45) Date of Patent: Jan. 17, 2012

(54) SINGLE-EXCITON NANOCRYSTAL LASER

(75) Inventors: Victor I. Klimov, Los Alamos, NM (US); Sergei A. Ivanov, Albuquerque, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 595 days.

(21) Appl. No.: 12/152,554

(22) Filed: May 15, 2008

(65) Prior Publication Data
US 2009/0116524 A1     May 7, 2009

Related U.S. Application Data

(60) Provisional application No. 60/930,817, filed on May 17, 2007.

(51) Int. Cl.
*H01S 5/00*     (2006.01)
(52) U.S. Cl. ..... 372/44.01; 372/39; 372/41; 372/44.011

(58) Field of Classification Search ............... 372/44.01, 372/44.011, 39
See application file for complete search history.

(56) References Cited

U.S. PATENT DOCUMENTS
6,819,692 B2    11/2004   Klimov et al.
2004/0110002 A1    6/2004   Kim et al.

OTHER PUBLICATIONS

Ivanov et al. (Light Amplification Using Inverted Core/Shell Nanocrystals: Towards Lasing in the Single-Exciton Regime; J. Phys. Chem. B 2004, 108, pp. 10625-10630).*
Ivanov et al., 2004, J. Phys. Chem. B 2004 10625-10630.

\* cited by examiner

*Primary Examiner* — Dung Nguyen
(74) *Attorney, Agent, or Firm* — Bruce H. Cottrell; Meredith H. Schoenfeld (57) ABSTRACT

A laser system employing amplification via a single exciton regime and to optical gain media having single exciton amplification is provided.

1 Claim, 7 Drawing Sheets

SINGLE-EXCITON NANOCRYSTAL LASER

RELATED APPLICATIONS

This application claims the benefit of provisional patent application Ser. No. 60/930,817 filed on May 17, 2007.

STATEMENT REGARDING FEDERAL RIGHTS

This invention was made with government support under Contract No. DE-AC52-06NA25396 awarded by the U.S. Department of Energy. The government has certain rights in the invention.

FIELD OF THE INVENTION

The present invention relates to lasers employing amplification via a single exciton regime and to optical gain media providing single exciton amplification.

BACKGROUND OF THE INVENTION

Nanocrystal quantum dots show high photoluminescence quantum yields and size-dependent emission colors that are tunable through the quantum-confinement effect. Despite these favorable light-emitting properties, nanocrystals are difficult to use in optical amplification and lasing. Because of almost exact balance between absorption and stimulated emission in nanoparticles excited with single electron-hole pairs (excitons), optical gain can only occur due to nanocrystals that contain at least two excitons. A complication associated with this multiexcitonic nature of light amplification is fast optical-gain decay induced by nonradiative Auger recombination, a process in which one exciton recombines by transferring energy to another.

Numerous technologies including optical interconnects in microelectronics, lab-on-a-chip, chemo- and bio-analyses, optical telecommunications, and information processing would benefit greatly from flexible, chemically processable optical-gain materials that can be manipulated using simple solution-based techniques. One class of materials is colloidal semiconductor nanocrystals (NCs) also known as NC quantum dots. NCs are nanoscale crystalline particles surrounded by a layer of organic ligand molecules. The dual inorganic-organic nature of these structures provides great flexibility for controlling their physical and chemical properties. For example, using quantum-confinement effect, the NC emission energy can be tuned by hundreds of milli-electron volts by simply changing the inorganic-core size. On the other hand, relatively straightforward surface chemistry can be applied to tune NC chemical reactivity to facilitate their incorporation into, e.g., nanophotonic or nanoplasmonic feedback structures for fabricating micro-lasers of various configurations.

Well-passivated NCs are characterized by near-unity photoluminescence (PL) quantum yields. Despite these favorable light-emitting properties, NCs are difficult to use in lasing applications. Because of the degeneracy of the lowest-energy emitting levels, population inversion in NCs can only be achieved if the average number of electron-hole pairs (excitons) per NC, <N>, is greater than 1, which implies that at least some of the NCs in the sample must contain multiexcitons. A significant complication arising from this multiexcitonic nature of optical amplification in NCs is highly efficient nonradiative Auger recombination induced by confinement-enhanced exciton-exciton (X-X) interactions. This process results in fast optical decay characterized by picosecond time scales. Demonstrated approaches to reducing Auger rates include the use of elongated NCs or quantum rods (see, Kazes et al., Adv. Mater. 14, 317-321 (2002) and Htoon et al., Phys. Rev. Lett. 91, 227401-1-4 (2003)) or core-shell hetero-NCs that allow the decrease of X-X coupling without losing the benefits of strong quantum confinement (see, Ivanov et al., J. Phys. Chem. B 108, 10625-10630 (2004)).

However, the most radical strategy for solving the problem of Auger decay is the development of methods or structures that would allow realization of optical gain in the single-exciton regime, for which Auger recombination is simply inactive.

SUMMARY OF THE INVENTION

To achieve the foregoing and other objects, and in accordance with the purposes of the present invention, as embodied and broadly described herein, the present invention provides a method for obtaining single-exciton optical gain by exciting type II semiconductor nanocrystals with a suitable energy source, and, obtaining optical amplification due to single excitons from said type II semiconductor nanocrystals without involvement of multiexciton states.

In another embodiment, the present invention further provides a type II core/shell semiconductor nanocrystal optical gain media providing spatial separation of electrons and holes into either said core or said shell whereby a strong local electric field can be generated so as to allow amplified spontaneous emission in a single excitonic regime without involvement of multiexciton states.

In another embodiment, the present invention further provides a single exciton laser assembly including a type II semiconductor nanocrystal optical gain media capable of producing single-exciton optical gains essentially without involvement of multiexcitons, and a cavity arranged relative to the optical gain media to provide feedback, wherein the type II semiconductor nanocrystal optical gain media provides gain to an optical signal at an energy equal to or less than the maximum band gap emission of type II semiconductor nanocrystals.

DETAILED DESCRIPTION

The present invention concerns single exciton optical gain, a method for obtaining such single exciton optical gain and a laser system employing such single exciton optical gain. The present invention also concerns a method for obtaining single-exciton optical gain and lasing by using strong exciton-exciton interactions that displace the absorbing transition in singly excited nanocrystals with respect to the emission line. The present invention also concerns a method for obtaining strong exciton-exciton interactions and single-exciton optical gain and lasing by spatially separating electrons and holes in a nanocrystal. The present invention also concerns a method for obtaining strong exciton-exciton interactions and single-exciton optical gain and lasing by using type-II hetero-nanocrystals in which electrons and holes are spatially separated by the energy gradient exciting at the hetero-interface. The present invention also concerns a method for obtaining strong exciton-exciton interactions and single-exciton optical gain and lasing by using type-II hetero-nanocrystals fabricated using a core/shell approach. The present invention also concerns a method for obtaining strong exciton-exciton interactions and single-exciton optical gain and lasing by using type-II hetero-nanocrystals fabricated using hetero-structured quantum rods or more complex geometries such as tetrapods. The present invention also concerns a method for obtaining strong exciton-exciton interactions and single-exciton optical gain and lasing by using type-II hetero-nanocrystals made using combinations of materials such as CdS/ZnSe, and ZnTe/CdSe.

A practical approach has now been demonstrated for obtaining optical gain in the single-exciton regime, which completely eliminates the problem of Auger decay. Specifically, core-shell hetero-nanocrystals can be prepared in such a way as to spatially separate electrons and holes between the core and the shell (type-II hetero-structures). The resulting imbalance between negative and positive charges produces a strong local electric field, which induces a giant (about 100 meV or greater) transient Stark shift of the absorption spectrum with respect to the luminescence line of singly excited nanocrystals. This effect breaks the exact balance between absorption and stimulated emission and allows demonstration of optical amplification due to single excitons.

Single exciton gain requires strong exciton-exciton interactions. Type II NCs are one possible way to get such strong exciton-exciton interactions. A core/shell geometry for the type II NCs is one possible geometry, but other geometries such as heterostructured nanorods or terapods may be used as well.

Practical implementation of one such method of realizing optical gain in the single-exciton regime, for which Auger recombination is simply inactive, is the basis of the present invention. The present invention makes use of type-II core/shell hetero-NCs. These hetero-structures are prepared in such a way so as to separately confine electrons and holes into the core and shell respectively. Spatial separation between negative and positive charges results in a strong local electric field, which leads to effective splitting of the degeneracy of the lowest-energy transition by the Stark effect and displaces the absorbing band in singly excited NCs with respect to the emission line. By significantly reducing absorption losses, this effect allows for optical amplification in the single-exciton regime.

Figure 1A:
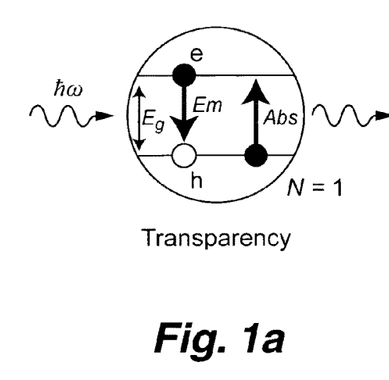
FIG. 1(a)-1(c) show schematic drawings of single exciton nanocrystal lasing in accordance with the present invention.

Optical gain corresponds to a light-matter interaction regime for which generation of photons by stimulated emission dominates over photon absorption. As in other lasing media, optical gain NCs requires population inversion, i.e., the situation in which the number of electrons in the excited state is greater than that in the ground state. The lowest-energy emitting transition in NCs of II-VI semiconductors studied can be described in terms of a two-level system that has two electrons in the ground state. Excitation of a single electron (single exciton) across the energy gap (Eg) in the system does not produce optical gain but rather results in optical transparency, for which stimulated emission by a conduction-band electron Is exactly compensated by absorption due to the electron remaining in the valence band (see FIG. 1a). Stimulated emission dominated over absorption only if the second electron is also excited across the energy gap indicating that optical gain requires doubly excited NCs, i.e., biexcitons. These considerations imply that population inversion in an NC ensemble can only be achieved if <N> is greater than 1.

Figure 1B:
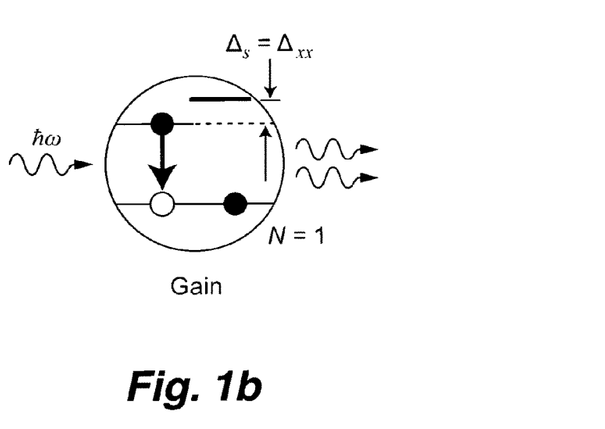
Figure 1C:
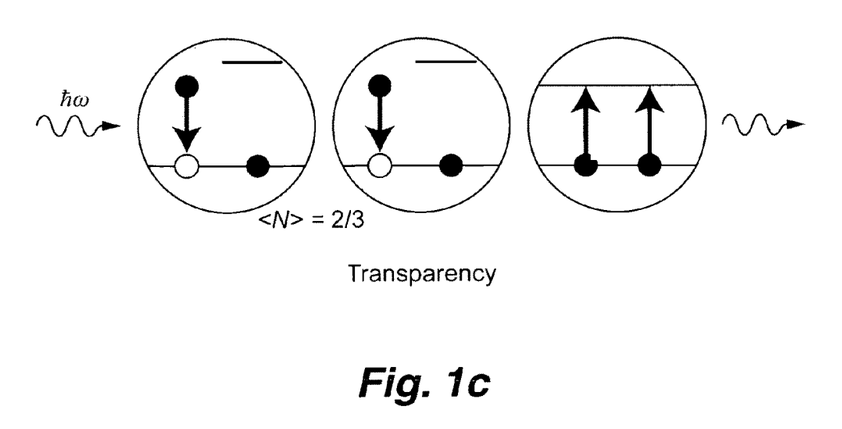

The condition for optical gain, however, changes if one accounts for a local electric field associated with an excited electron-hole pair. This field can alter the absorption energy of the electron remaining in the valence band by the carrier-induced Stark effect (see FIG. 1b). If the magnitude of the Stark shift ($\Delta_s$) is comparable to or greater than the transition line width ($\Gamma$), it can completely eliminate absorption losses at the emission wavelength in excited NCs, which should allow optical gain using single-exciton states. Specifically, the threshold for population inversion in the presence of the transitient transition shift is determined by the condition $\langle N \rangle = 2/(3-\exp(-\Delta_s^2/\Gamma^2))$. If $\Delta_s << \Gamma$, it reduces to $\langle N \rangle = 1$, which corresponds to the usual case of multiexciton optical gain. However, if $\Delta_s >> \Gamma$, then $\langle N \rangle = \frac{2}{3}$ (see FIG. 1c), which implies that optical gain does not require multiexcitons.

The carrier-induced Stark effect can be described in terms of the Colomb interaction of the initially generated exciton with the exciton created in the second exciton act. In thesis description, the transient Stark shift is determined by the X-X Coulomb interaction energy ($\Delta_{xx} = \Delta_s$) defined as ($\Delta_{xx} = E_{xx} - 2E_x$, where $E_x$ and $E_{xx}$ are single- and biexciton energies, respectively. The X-X interaction strength is also often characterized in terms of the biexciton binding energy ($\delta E_{xx}$), which relates to $\Delta_{xx}$ by $\delta E_{xx} = -\Delta_{xx}$.

Figure 2A:
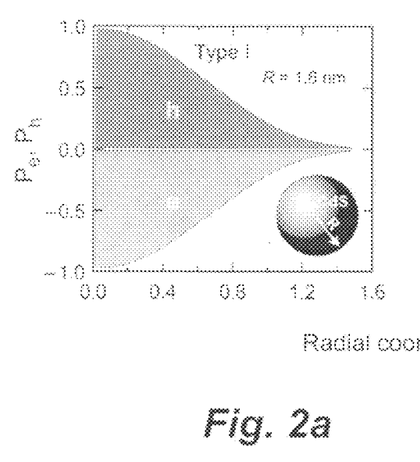
FIG. 2(a)-2(e) show type-I CdS nanocrystals and type-II CdS/ZnSe core/shell hetero-nanostructures used in the present invention.

The energy $\Delta_{xx}$ depends on the local electrical charge density $\rho_x(r)$ associated with a single-exciton state and, hence, on the sum of the hole ($\rho_h$) and the electron ($\rho_e$) charge densities: $\rho_x(r) = \rho_h(r) + \rho_e(r)$ (r is the spatial coordinate). Because of almost identical spatial distributions of electron ($\psi_e$) and hole ($\psi_h$) wavefunctions, $\rho_x(r)$ is nearly zero in homogeneous NCs [$(\rho_X(r) = e(|\psi_h(r)|^2 - |\psi_e(r)|^2) \approx 0$), e is the electron charge] (see FIG. 2a), which leads to relatively small X-X interaction energies of about 10 to about 30 meV. These values are smaller than typical transition line widths in existing NC samples (ensemble broadening of about 100 meV or greater) and, therefore, do not allow significant suppression of absorption at the emission wavelength.

Figure 2B:
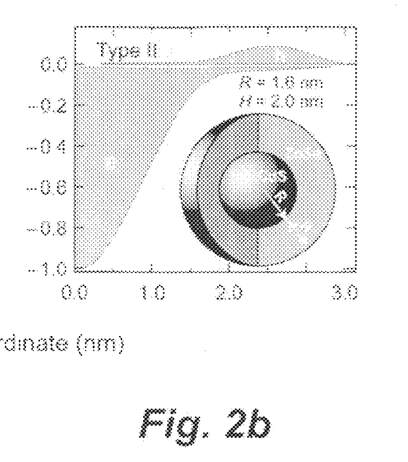
Figure 2C:
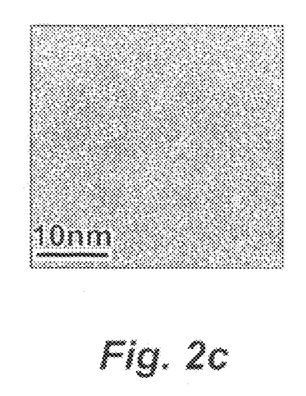
Figure 2D:
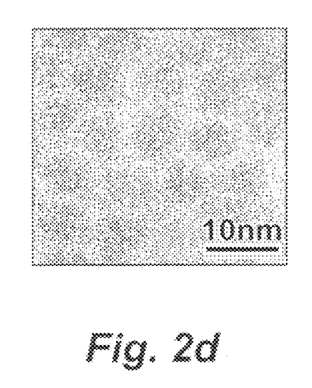
Figure 2E:
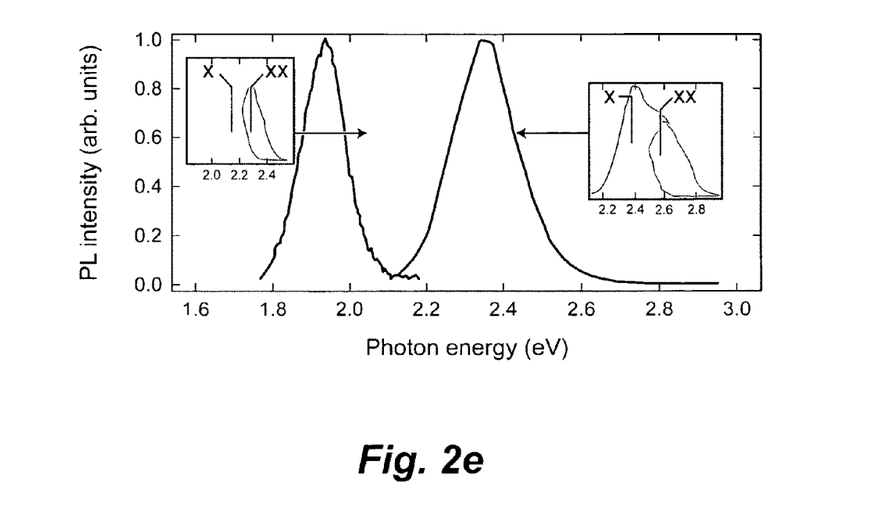

The separation of electrons and holes between the core and the shell in type-II NCs (see FIG. 2b) can lead to sizable local charge densities and, hence, large Coulomb interaction energies. To analyze the effect of charge separation on X-X interactions and its influence on optical gain properties of NCs, hetero-nanostructures composed of a CdS core overcoated with a ZnSe shell (see FIG. 2b, inset) were studied. These nanostructures were synthesized by reacting prefabricated CdS core particles (formed by the process described by Cao et al., J. Am. Chem. Soc., v. 126, 14336-14337 (2004)) with Zn/Se precursors, which results in CdS(core)/ZnSe(shell) NCs (see FIGS. 2c and 2d). As shown in FIG. 2e, the emission color produced by these NCs can be tuned from red to green by varying the core radius and/or the shell thickness.

Figure 3A:
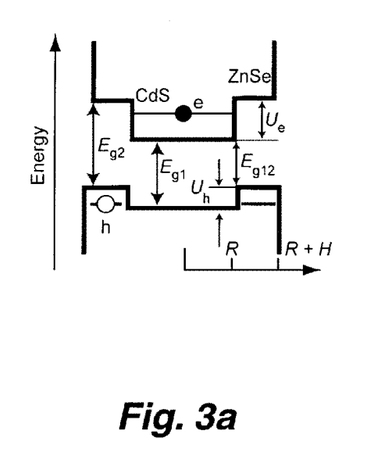
FIG. 3(a)-3(d) show electronic structure and different localization regimes in CdS/ZnSe core/shell nanocrystals in accordance with the present invention.
Figure 3B:
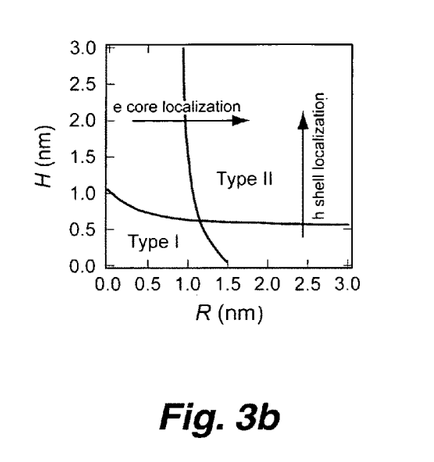

According to bulk-semiconductor parameters, the bottom of the conduction band is lower in CdS than in ZnSe, while the top of the valence band is higher for ZnSe (see FIG. 3a). Therefore, the electron-hole pair generated near the bulk CdS/ZnSe hetero-interface tends to produce a charge-separated state with the electron residing in the CdS and the hole residing in the ZnSe. This situation corresponds to the type-II regime, while the regime for which the electrons and holes co-occupy the same part of a hetero-structure is usually referred to as type I. In contrast to a fixed alignment of energy levels at the bulk CdS/ZnSe hetero-interface, the alignment of energy states in CdS/ZnSe NCs depends upon the core radius (R) and the shell width (H), which determine the positions of quantized levels with respect to the bulk band edges (see the "localization" phase diagram in FIG. 3b). Specifically, for small core radii (R<1.2 to 1.5 nm) and thin shells (H<0.6 to 1.0 nm), these structures yield type-I localization (see the shaded area in the lower left corner of FIG. 3b), while the type of localization changes to type-II for larger R and H (see the shaded area in the upper right corner of FIG. 3b). For the type-I regime, m an electron and hole are delocalized over the entire hetero-NC and their charge densities nearly cancel each other (see FIG. 2a). In the type-II case, electrons reside in the core while holes reside in the shell, which leads to a significant difference in the spatial distributions of negative and positive charges and, hence, large local charge densities (see FIG. 2b).

Figure 3C:
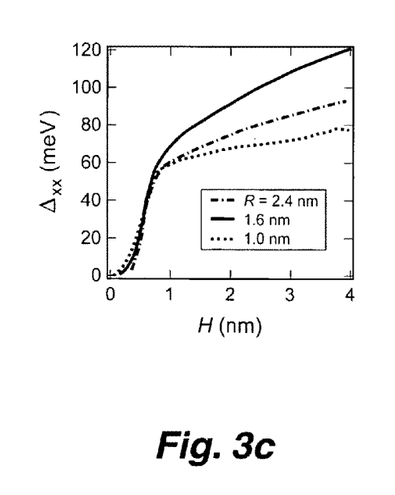
Figure 3D:
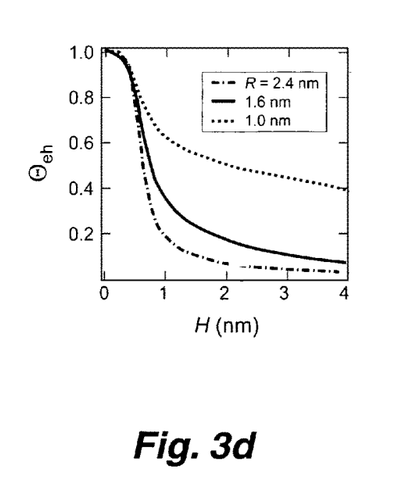

A convenient quantity for describing the spatial separation between electrons and holes is the electron-hole overlap integral $\Theta_{eh}=|\langle\psi_h|\psi_e\rangle|^2$. This quantity also provides a measure of the imbalance between negative and positive charges in the NC and, therefore, the changes in $\Theta_{eh}$ directly correlate with variations in the X-X interaction energy. This effect is shown in FIG. 3, which shows $\Delta_{xx}$ (panel c) and $\Theta_{eh}$ (panel d) calculated for CdS/ZnSe NCs for fixed core radii (R=1.0, 1.6 and 2.4 nm) and a varied shell width (see supplemental information section below for details of these calculations). It was observed that the initial increase in H leads to a rapid drop of the overlap integral due to transition to the type-II regime. The reduction in $\Theta_{eh}$ is accompanied by a rapid increase of $\Delta_{xx}$ because of an increasing imbalance between positive and negative charges. Specifically, for R=1.6 nm and H>2 nm ($\Theta_{eh}$<0.17), $\Delta_{xx}$ can reach giant values of about 100 meV.

It is interesting to examine the sign of the X-X interaction energy. In type-I NCs, Coulomb interactions tend to spatially arrange charges in a way that the biexciton energy $E_{xx}$ is reduced compared to twice the single-exciton energy $E_x$. This situation corresponds to a negative value of $\Delta_{xx}$ (positive biexciton binding energy), which can be interpreted in terms of an effective X-X attraction. In type-II NCs, the spatial distribution of charges is controlled not by Coulomb interactions but by large energy gradients at the core/shell interface, which leads to concentration of the same-sign charges in the same part of the hetero-NC (both electrons are in the core; both holes are in the shell) and spatial separation of charges of the opposite sign across the hetero-interface. This type of spatial arrangement increases the repulsive component of the Coulomb interaction and decreases its attractive component, which produces net X-X repulsion (negative biexciton binding energy), as indicated by the positive sign of the calculated values of $\Delta_{xx}$ (shown in FIG. 3c). X-X repulsion can also be obtained in type-I NCs if there is accounting for the difference between the conduction- and valence-band structures. However, the latter repulsion is significantly smaller than the repulsion discussed herein and is therefore neglected in the calculations.

The $\Delta_{xx}$ sign has an important effect on the optical-gain properties of NCs because it determines the direction of the Stark shift of the absorbing transitions with respect to the emission line. If $\Delta_{xx}$ is negative (X-X attraction), the transitions move downward in energy, which may have a detrimental effect on lasing performance because of increasing absorption due to the manifold of strong transitions located immediately above the emitting band. On the other hand, strong X-X repulsion, which can be produced in type-II NCs, should benefit lasing because it moves strongly absorbing transitions away from the emission line.

In order to experimentally measure X-X interaction energy in type-II core/shell NCs, the position of the biexciton PL band with respect to the single-exciton line was compared. Radiative recombination of the biexciton produces a photon ($\hbar\omega_{xx}$) and the exciton and hence, $\hbar\omega_{xx}=E_{xx}-E_x=E_x+\Delta_{xx}$. Based on the latter expression, the shift of the biexciton line with respect to the single-exciton band ($\hbar\omega_x=E_x$) provides a direct measure of the X-X interaction energy: $\Delta_{xx}=\hbar\omega_{xx}-\hbar\omega_x$.

The challenge in experimentally detecting PL from NC multiexcitons is associated with their short (picoseconds to hundreds of picoseconds) lifetimes, which are limited by nonradiative Auger recombination. Because these times are significantly shorter than the radiative time constants, multi-excitons are not well pronounced in steady-state PL spectra. Therefore, in order to detect the emission from multiexcitons, time-resolved PL measurements were applied, in which emission of NCs excited by 200-femtosecond (fs), 3-electron Volt (eV) pulses was analyzed using time-correlated single-photon counting (about 30 picosecond (ps) time resolution).

Figure 4A:
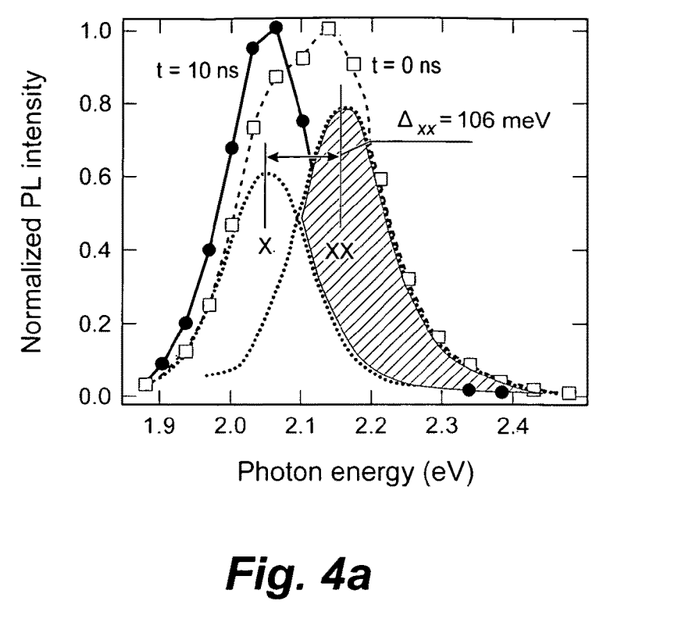
FIG. 4(a)-4(b) shows experimental demonstration of giant X-X repulsion in type-II CdS/ZnSe core/shell nanocrystals in accordance with the present invention.

FIG. 4a shows PL spectra of a hexane solution of CdS/ZnSe NCs with R=1.6 nm and H=2 nm recorded at a pump fluence that corresponds to excitation of approximately 1.5 excitons per NC on average. According to the phase diagram in FIG. 3b, the NCs used in these measurements correspond to the type-II regime, for which electrons and holes are well separated between the core and the shell. The long-time spectrum recorded at time t=10 ns after excitation (solid circles in FIG. 4a) is identical to the steady-state PL spectrum observed at low excitation fluences (<N><<1) and corresponds to emission of single excitons ($E_x$=2.054 eV). The t=0 PL (open squares) indicates the presence of an additional high-energy, short-lived band at 2.160 eV, which decays with a time constant of about 130 ps. This band (the XX feature shown in FIG. 4a) can be extracted from the t=0 spectrum by subtracting an appropriately scaled long-time spectrum (see the X feature in FIG. 4a).

Figure 4B:
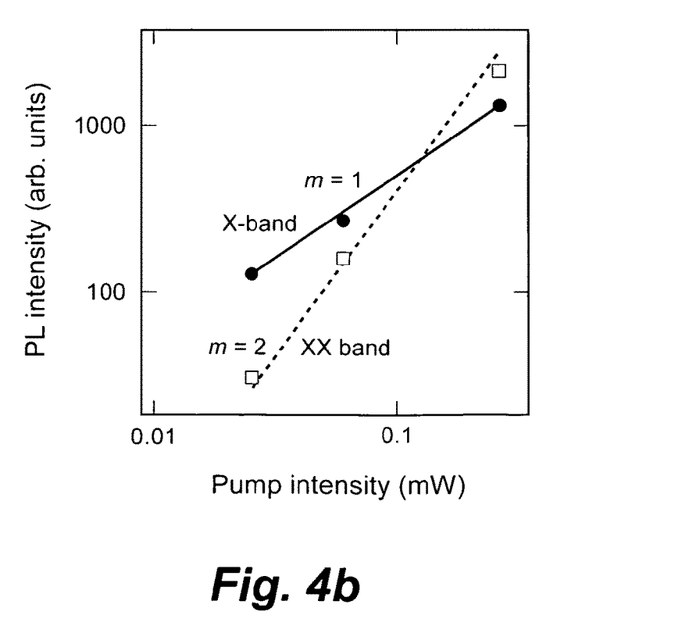

The measured pump-intensity dependences indicate that the growth of the X band is linear in pump fluence (see solid circles in FIG. 4b) as expected for single-exciton emission. On the other hand, the high-energy XX band shows a quadratic growth (see open squares in FIG. 4b), which is typical for emission from biexcitons. The fast decay of this feature is also consistent with its multiexciton origin and is due efficient Auger recombination. Further, this band cannot be attributed to recombination of carriers populating excited NC states because according to transient absorption results, the first optical transition involving excited electronic states in these NCs is located at about 2.254 eV, which is nearly 100 meV higher than the XX feature. Based on these considerations, the XX band can be assigned to emission from a biexciton, which comprises two ground-state 1S excitons.

The fact that biexciton emission occurs at higher energies than the single-exciton PL indicates that the repulsive character of the X-X interaction as predicted by modeling. Further, based on the measured spectral positions of X and XX bands, a value for $\Delta_{xx}$=106 meV was obtained, which is in good agreement with the value of 91 meV calculated for NCs with the geometrical parameters investigated. Strong X-X repulsion ($\Delta_{xx}$>100 meV) is consistently observed for type-II CdS/ZnSe NC samples with a wide range of emission colors as illustrated in the two insets of FIG. 2e. Large X-X interaction energies (about 80 meV) were also detected for type-II NCs of a different composition [ZnTe(core)/CdSe(shell)] with emission in the near infrared (770 nm). All of the observations indicate the generality of giant X-X interaction energies in strongly confined type-II colloidal nanoparticles.

To analyze light amplification in type-II CdS/ZnSe NCs, their optical-gain properties were compared with those of traditional type-I CdSe NCs with matching emission wavelengths (see FIG. 5). For the biexcitonic gain mechanism operating in type-I NCs, a sharp peak of amplified spontaneous emission (ASE) is red-shifted with respect to the single-exciton band (see FIG. 5a, upper spectrum) because of X-X interaction, which decreases the emission energy of biexcitons compared to that of single excitons. For type-II samples, it was observed that as the pump level was increased, a new, sharp emission feature developed near the position of the single-exciton band (2.01 eV) (see FIG. 5b, and the lower spectrum in FIG. 5a). This new peak shows a clear excitation threshold of about 2 millijoules per square centimeter (mJ $cm^{-2}$) and a fast, super-linear growth with increasing pump fluence (see FIGS. 5b and 5c). The development of a similar sharp feature was also detected using a fixed pump fluence and increasing the size of the excitation spot (variable-stripe-length configuration). These behaviors are consistent with the ASE regime. An important observation was that the ASE peak develops near the center of the X band indicating that it is due to stimulated emission of single excitons. This assignment was further confirmed by the observation of a second ASE feature at higher fluences (excitation threshold of about 6 mJ $cm^2$), which developed near the position of the high-energy XX band and is due to the traditional biexcitonic gain mechanism (see FIGS. 5b and 5c). Similar trends were observed for type-II NCs with other emission wavelengths. For example, with a sample emitting at about 2.21 eV, the emergence of a single-exciton ASE feature was detected, which was followed by the development of a bluer biexcitonic ASE band at about 2.36 eV at higher pump fluences.

Figure 5A:
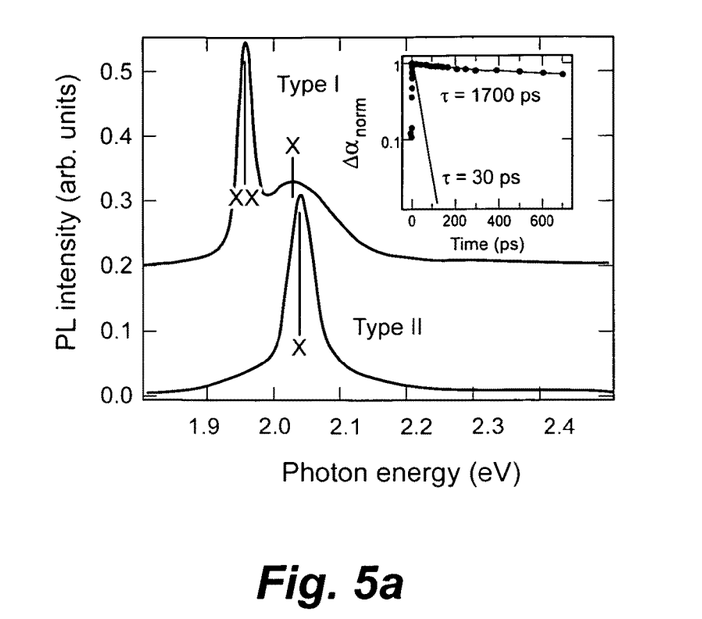
FIG. 5(a)-5(d) shows optical amplification in type-I and type-II nanocrystals in accordance with the present invention.
Figure 5B:
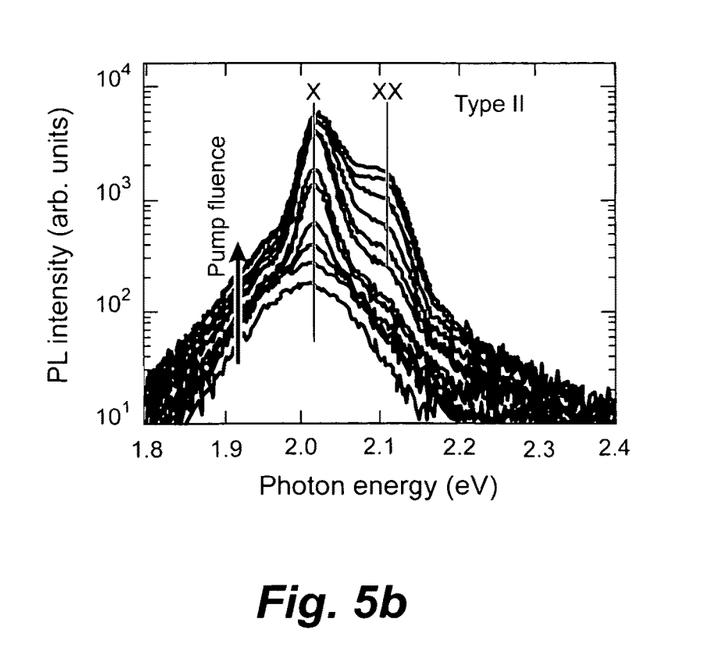
Figure 5C:
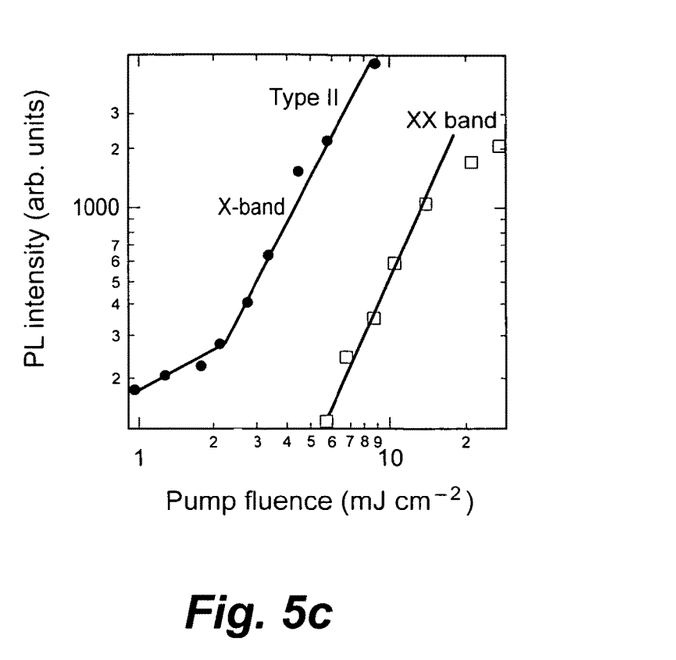
Figure 5D:
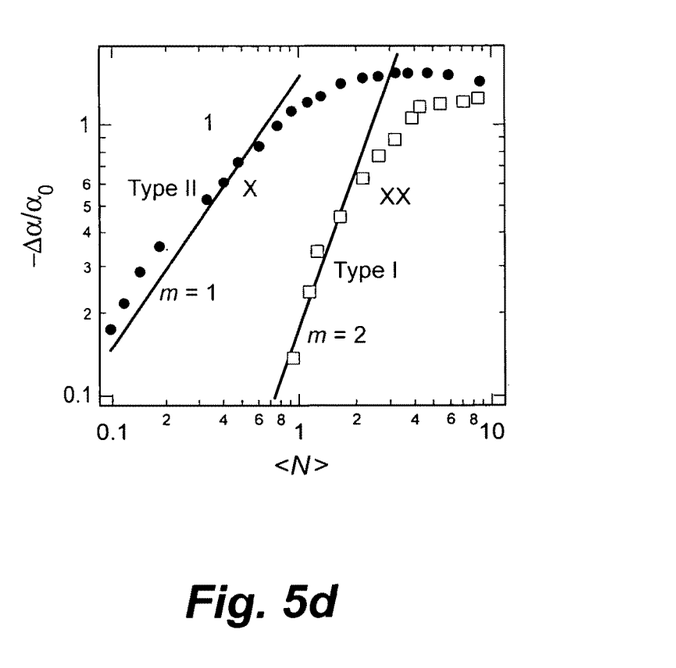

To further verify the single-exciton character of light amplification in type-II NCs, direct measurements were performed of optical gain using a transient absorption experiment. In these measurements, the absorption change ($\Delta\alpha$) induced in a sample by a short, 100-fs pulse was monitored using a broadband pulse of a femtosecond white-light continuum. The transition to optical gain corresponds to the situation for which absorption bleaching ($\Delta\alpha<0$) becomes greater than absorption of an unexcited sample ($\alpha_o$). FIG. 5d shows the dependence of the normalized absorption bleaching ($-\Delta\alpha/\alpha_o$) on the average number of excitons per NC for type-I (squares) and type-II (circles) NCs. In addition to a lower gain threshold (a factor of about 5 in difference), type-II structures clearly show a different functional dependence in the development of the optical gain. In the type-II sample, the initial growth of $|\Delta\alpha|$ is linear (straight line 15), while in the type-I NCs it is quadratic (straight line 20). These observations are consistent with single-exciton (type II) and biexciton (type I) mechanisms of optical gain in these two types of nanostructures.

The single-exciton-gain regime demonstrated herein should significantly simplify real-life applications of chemically synthesized NCs in lasing technologies and specifically should allow realization of NC lasing under continuous-wave (cw) excitation. The pump intensity threshold $I_o$ for producing cw gain is approximately determined by the ratio of the threshold fluence measured using ultrafast excitation (see, e.g., FIG. 5c) and the gain lifetime. Because of Auger recombination, this lifetime is in the sub-100 ps range for the multiexcitonic gain mechanism, which leads to very high cw lasing thresholds that are well above the NC photostability limit. For single-exciton gain, the intrinsic gain dynamics are determined by the radiative single-exciton lifetime, which are typically orders of magnitude longer than Auger-decay time constants. The difference in relaxation behaviors for single- and biexciton gain mechanisms is illustrated in the inset of FIG. 5a, which shows relaxation dynamics of $\Delta\alpha$ measured at the onset of optical gain for type-I (circles 25) and type-II (circles 30) samples. In type-I NCs the measured decay time is 30 ps while it is more than 50 times longer (1700 ps) for the type-II NCs.

Thus, the present invention provides the first practical demonstration of NC structures that produce optical amplification due to stimulated emission of single-exciton states, which eliminates complications associated with ultrafast multiexciton Auger recombination. This new approach makes use of dynamic splitting of the degeneracy of the lowest energy emitting transition by giant X-X interactions that develop in type-II hetero-structures upon spatial separation of electrons and holes. Implementation of the single-exciton gain regime could allow reduction of the lasing threshold under cw excitation by orders of magnitude, which could significantly enhance the technological potential of colloidal NCs as "soft", chemically processable optical-gain media.

The preparation of materials used in the present invention is more particularly described in the following examples, which are intended as illustrative only, since numerous modifications and variations will be apparent to those skilled in the art.

EXAMPLE 1

Myristic acid (MA, 99.5%, Acros), tetraethylthiuram disulfide (TETD, 97%, Acros), 2,2'-dithiobisbenzothiazole (99%, Acros), Cd(AcO)$_2$*2H$_2$O (98%, Acros), Zn(AcO)$_2$* 2H$_2$O (99%, Acros), ZnEt$_2$ (98%, Strem), Se shot (99.9999%, Acros), tri-n-octylphosphine (TOP, 97%, Strem), anhydrous hexane (Aldrich), methanol (Aldrich), chloroform (Acros), toluene (Aldrich), and butanol (Aldrich) were used as purchased. Tri-n-octylphosphine oxide (TOPO, 90%, Fisher), hexadecylamine (HDA, 98%, Lancaster), octadecylamine (ODA, 90%, Acros), 1-octadecene (ODE, 90%, Acros), and oleic acid (OA, 90%, Aldrich) were used as is but were dried and degassed in vacuum for 2-3 hours at 120° C. shortly before use. All reactions were conducted under nitrogen atmosphere using the Schlenk technique.

Synthesis of type-II core/shell CdS/ZnSe nanocrystals was as follows. First, CdS nanocrystals were prepared as follows. Synthesis of highly monodisperse cubic CdS nanocrystals (NCs) was performed according to the recently published method of Cao et al., J. Am. Chem. Soc. 126, 14336 (2004). In a typical procedure, large CdS NCs (ca. 2.5 nm radius) were synthesized as follows. 0.266 g (1 mmol) of Cd(AcO)$_2$* 2H$_2$O, 0.4567 g (2 mmol) of MA, 5.14 mL of 0.1 M sulfur solution in ODE (0.514 mmol), 1.3 mL of 0.05 M TETD solution in ODE (65 µmol), and 0.064 g of 2,2'-dithiobisbenzothiazole (192 µmol) were all placed in a 100 mL flask with 30 mL of ODE and heated in vacuum for 1 hour at 120° C. Subsequently, the flask with the reaction mixture was filled with N$_2$ and slowly heated (about 6° C./min) to 240° C. The solution turned dark yellow as the temperature reached 240° C. The particle size was monitored by recording Uv-Vis and photoluminescence (PL) spectra of growth-solution aliquots in CHCl$_3$. For sizes that corresponded to emission wavelengths longer than 470 nm, CdS NCs became insoluble in the reaction mixture (corresponding growth times were 30 min or longer at 240° C.); for these larger sizes it was also observed that the solution became turbid. After a desired particle size was reached, the growth solution was cooled down and washed twice with $CHCl_3$ and toluene to remove byproducts and free ligands; synthesized CdS particles were not soluble in either solvent.

Then, the CdS NCs were purified with pyridine. Synthesized CdS NCs required extra purification to ensure that no Cd(II) was left as adsorbent on the NC surface. After precipitation and washing of these NCs with acetone, the solvent was removed in vacuo and 5-10 mL of pyridine were added to a vial with 10-20 mg of dry CdS NCs. Stirring the mixture for 12 hours at 50° C. lead to full dissolution of NCs in pyridine. The NCs were precipitated from pyridine with water, redissolved in acetone, and again precipitated with water. The washed NCs were dissolved in hexane and used in the synthesis of CdS/ZnSe core/shell structures.

Overcoating with ZnSe was as follows. In a typical overcoating procedure, 20 mg of CdS NCs were dispersed (or dissolved, for smaller sizes) in hexane and injected into a degassed mixture of ODA (1.5 g) and ODE (6 mL) at 120° C. Following the injection, the solution was placed under vacuum for 20-30 minutes to remove hexane. Subsequently, the solution was returned back under $N_2$ atmosphere and was heated to 220-240° C.

Separately, the 0.1 M solution of zinc oleate, $Zn(OA)_2$, in TOP was prepared by mixing of $Zn(AcO)_2$ in TOP with the equivalent amount of oleic acid. 4-5 mL of the 0.1 M $Zn(OA)_2$ solution were mixed with the stoichiometric amount of 1M Se solution in TOP and added dropwise to the flask with CdS NCs. The rate of the addition was typically 8-9 mL/hour (i.e., $10^{-3}$ moles of Zn(II) per hour). Upon Zn/Se addition, the solution colour changed from lemon-yellow to red. After the addition, temperature of the reaction mixture was lowered to 150-170° C., and the solution was annealed at this temperature for 24-48 hours in order to increase the PL QY of formed CdS/ZnSe core-shell NCs. To complete the annealing, the temperature was lowered to 80-90° C. and CdS/ZnSe NCs were precipitated with acetone and centrifuged. Supernatant was discarded and the product was washed with MeOH and acetone. After washing and centrifugation, purified NCs were dissolved in toluene or hexane and stored in the dark. The PL QY of CdS/ZnSe NCs after annealing was in the range of 10 to 15%.

EXAMPLE 2

CdS/ZnSe interface alloying was as follows. A further increase in the PL QY of CdS/ZnSe NCs can be obtained by alloying the core/shell interface with CdSe. In a typical alloying procedure, the $Cd(AcO)_2 * 2H_2O$ solution in TOP was injected into the CdS NC solution in ODA/ODE prior to addition of the Zn/Se precursors. The amount of extra Cd(II) added to the solution was 1-10% of the molar amount of Zn(II) used in the subsequent shell deposition. Slight excess of Se/TOP (10-20%) compared to the total amount of added Cd(II) and Zn(II) was used. The rest of the procedure was the same as during the fabrication of the ZnSe shell. PL QYs of alloyed CdS/ZnSe NCs were as high as 30 to 35%.

Although the present invention has been described with reference to specific details, it is not intended that such details should be regarded as limitations upon the scope of the invention, except as and to the extent that they are included in the accompanying claims.

What is claimed is:

1. A method for obtaining strong exciton-exciton interactions and single-exciton optical gain and lasing by spatial separation of electrons and holes between core and shell by using hetero-nanocrystals that exhibit a type-II energy offset in a bulk form fabricated using a core/shell approach.

* * * * *